United States Patent
Ballantyne

(10) Patent No.: US 7,825,844 B2
(45) Date of Patent: Nov. 2, 2010

(54) ADAPTIVE HIGH-ORDER DIGITAL-TO-ANALOG CONVERSION

(75) Inventor: Gary John Ballantyne, Christchurch (NZ)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/027,132

(22) Filed: Feb. 6, 2008

(65) Prior Publication Data
US 2009/0195426 A1     Aug. 6, 2009

(51) Int. Cl.
*H03M 1/66* (2006.01)
(52) U.S. Cl. ...................... 341/144; 341/143
(58) Field of Classification Search ............ 341/143, 341/110, 144, 122; 375/242, 247, 316
See application file for complete search history.

(56) References Cited

U.S. PATENT DOCUMENTS

| | | | | |
|---|---|---|---|---|
| 4,970,638 A | * | 11/1990 | Yeh et al. ................... | 700/30 |
| 5,532,926 A | * | 7/1996 | Dunn et al. .................. | 700/73 |
| 5,608,400 A | * | 3/1997 | Pellon ....................... | 341/143 |
| 6,124,816 A | | 9/2000 | Lee et al. | |
| 6,894,832 B1 | * | 5/2005 | Aweya et al. .......... | 359/341.41 |
| 6,940,436 B2 | | 9/2005 | Hezar et al. | |
| 7,194,036 B1 | * | 3/2007 | Melanson ................... | 375/247 |
| 7,574,327 B2 | * | 8/2009 | de Roover et al. ........... | 702/189 |

FOREIGN PATENT DOCUMENTS

| WO | 0227944 | 4/2002 |
|---|---|---|
| WO | 07082237 | 7/2007 |

OTHER PUBLICATIONS

International Search Report - PCT/US2009/033463, International Search Authority - European Patent Office - Nov. 5, 2009.
Written Opinion - PCT/US2009/033463, International Search Authority - European Patent Office - Nov. 5, 2009.

* cited by examiner

*Primary Examiner*—Brian Young
(74) *Attorney, Agent, or Firm*—Jiayu Xu

(57) ABSTRACT

Techniques for performing digital-to-analog conversion with first-order or higher-order hold using a simple analog circuit for signal reconstruction and employing feedback control techniques are described. In one design, a digital-to-analog conversion circuit includes an inverse model circuit, a feedback circuit, a zero-order hold (ZOH) circuit, and an analog circuit. The inverse model circuit processes a digital input signal and provides a first digital signal. The feedback circuit receives the first digital signal and an analog output signal from the analog circuit, performs low frequency noise filtering, and provides a second digital signal. The ZOH circuit converts the second digital signal from digital to analog with zero-order hold and provides an analog input signal for the analog circuit. The analog circuit operates on the analog input signal and provides the analog output signal. The analog circuit may be a simple circuit having one or more poles.

26 Claims, 8 Drawing Sheets

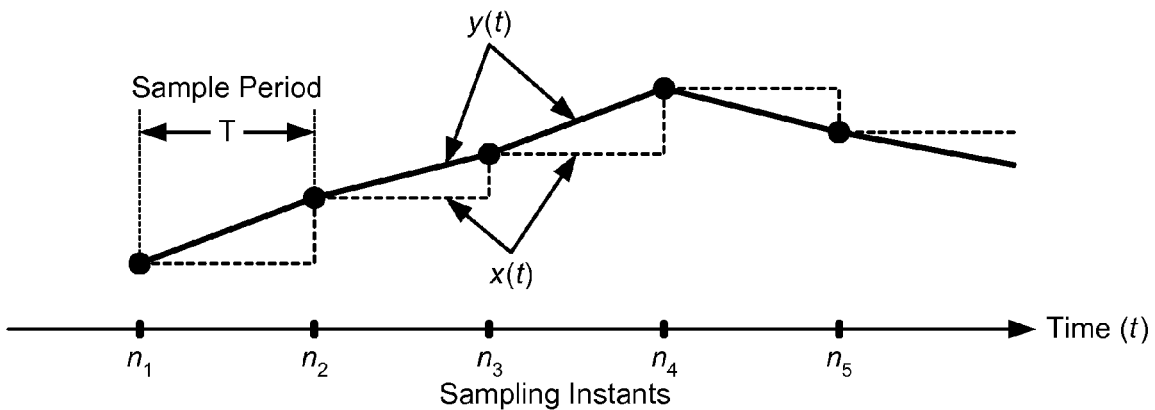
FIG. 8
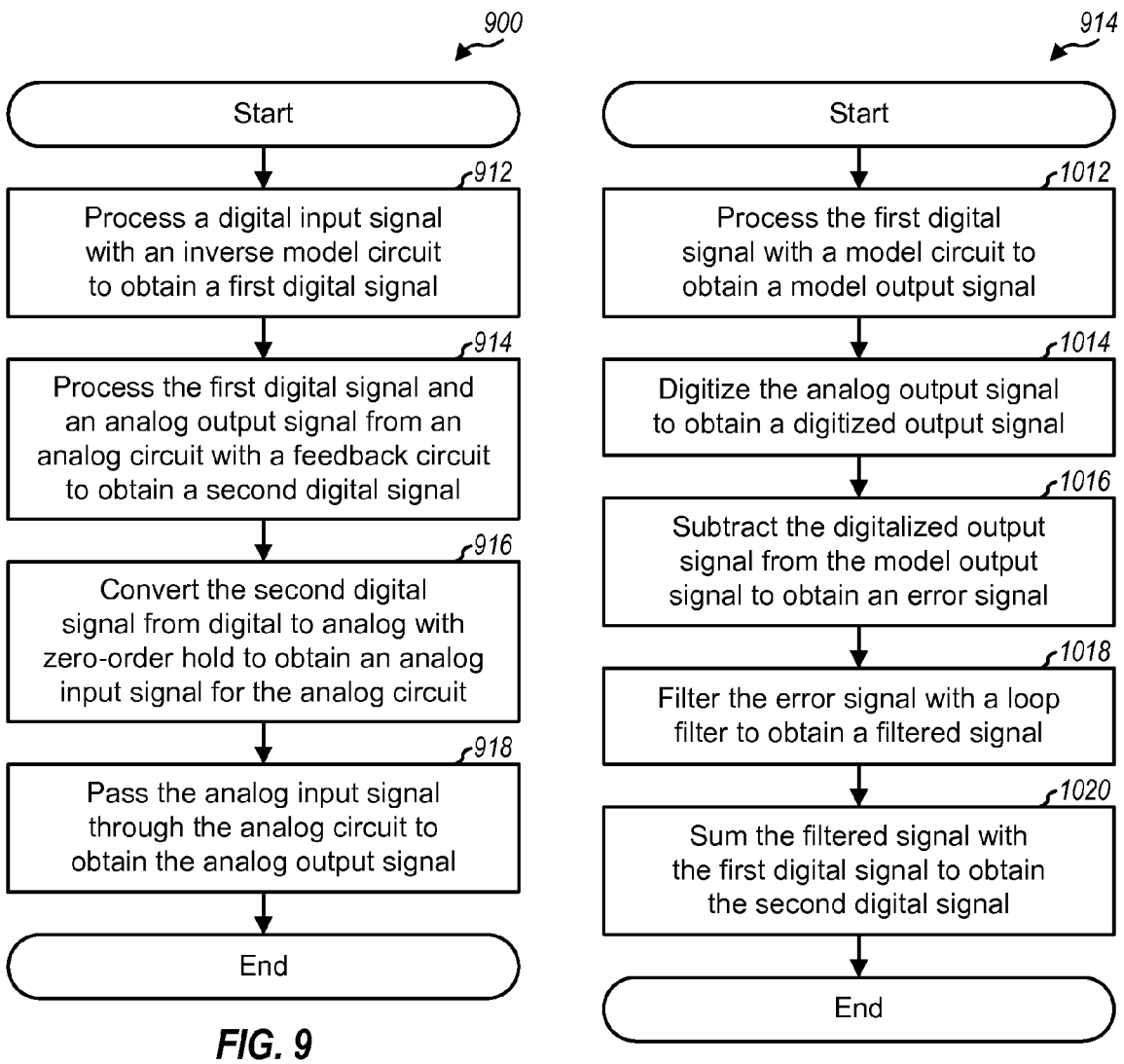
FIG. 9
FIG. 10

ADAPTIVE HIGH-ORDER DIGITAL-TO-ANALOG CONVERSION

BACKGROUND

I. Field

The present disclosure relates generally to electronics, and more specifically to techniques for performing digital-to-analog conversion.

II. Background

A digital-to-analog converter (DAC) is a circuit that receives a digital signal and outputs an analog signal. DACs are commonly used in various electronics devices to provide interface between digital circuits and analog circuits. For example, a wireless communication device such as a cellular phone may include one or more DACs to interface with a transmitter, an audio output circuit, a video output circuit, etc.

A DAC is typically used in combination with an analog circuit such as a reconstruction filter to filter the analog signal from the DAC. The analog circuit may be relatively complex and may increase the complexity and cost of an electronics device using the DAC. It is desirable to perform digital-to-analog conversion using a simple analog circuit in order to reduce complexity and cost.

SUMMARY

Techniques for performing digital-to-analog conversion with first-order or higher-order hold are described herein. The techniques utilize a simple analog circuit for signal reconstruction and employ feedback control techniques to improve low frequency behavior of the analog circuit and achieve good performance.

In one design, a digital-to-analog conversion circuit includes an inverse model circuit, a feedback circuit, a zero-order hold (ZOH) circuit, and an analog circuit. The inverse model circuit processes a digital input signal and provides a first digital signal. The feedback circuit receives the first digital signal and an analog output signal from the analog circuit, performs low frequency noise filtering, and provides a second digital signal. The ZOH circuit converts the second digital signal from digital to analog with zero-order hold and provides an analog input signal for the analog circuit. The analog circuit operates on the analog input signal and provides the analog output signal. The analog circuit may be a simple circuit having one or more poles.

In one design, the feedback circuit includes a model circuit, first and second summers, a loop filter, and an analog-to-digital converter (ADC). The model circuit operates on the first digital signal based on a transfer function $M(s)$ and provides a model output signal. The ADC digitizes the analog output signal and provides a digitized output signal. The first summer subtracts the digitalized output signal from the model output signal and provides an error signal. The loop filter filters the error signal and provides a filtered signal. The second summer sums the filtered signal and the first digital signal and provides the second digital signal. The feedback circuit performs noise filtering in order to improve the low frequency behavior of the analog circuit while minimally impacting the first digital signal.

The transfer function $M(s)$ of the model circuit may be adaptively determined based on a transfer function $G(s)$ of the analog circuit and a transfer function $Z(s)$ of the ZOH circuit. An adaptation circuit may estimate at least one parameter (e.g., a pole frequency and a gain) of the analog circuit. The transfer function $M(s)$ of the model circuit may then be implemented based on the estimated parameter(s). The inverse model circuit may have a transfer function of $M^{-1}(s)$, which is the inverse of the transfer function $M(s)$ of the model circuit.

Various aspects and features of the disclosure are described in further detail below.

BRIEF DESCRIPTION OF THE DRAWINGS

FIG. 8 shows an analog output signal with first-order hold.

FIG. 9 shows a process for performing digital-to-analog conversion.

FIG. 10 shows a process for feedback processing for digital-to-analog conversion.

DETAILED DESCRIPTION

Figure 1A:
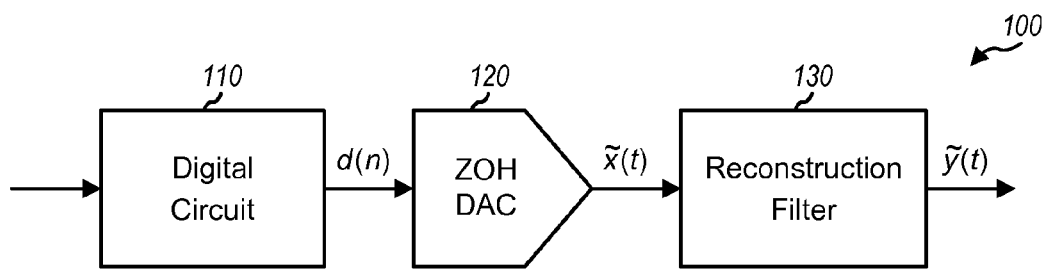
FIG. 1A shows conventional digital-to-analog conversion.

FIG. 1A shows a block diagram of a device 100 that performs digital-to-analog conversion in a conventional manner. Within device 100, a digital circuit 110 receives and processes digital data and provides a digital input signal $d(n)$, where n is a sample index. A DAC 120 converts the digital input signal from digital to analog with zero-order hold and provides an analog input signal $\tilde{x}(t)$, where t is a variable for continuous time. A reconstruction filter 130 filters the analog input signal and provides an analog output signal $\tilde{y}(t)$. Filter 130 may perform various functions such as attenuation of images caused by the digital-to-analog conversion, compensation for droop in the frequency response due to the zero-order hold, etc.

Figure 1B:
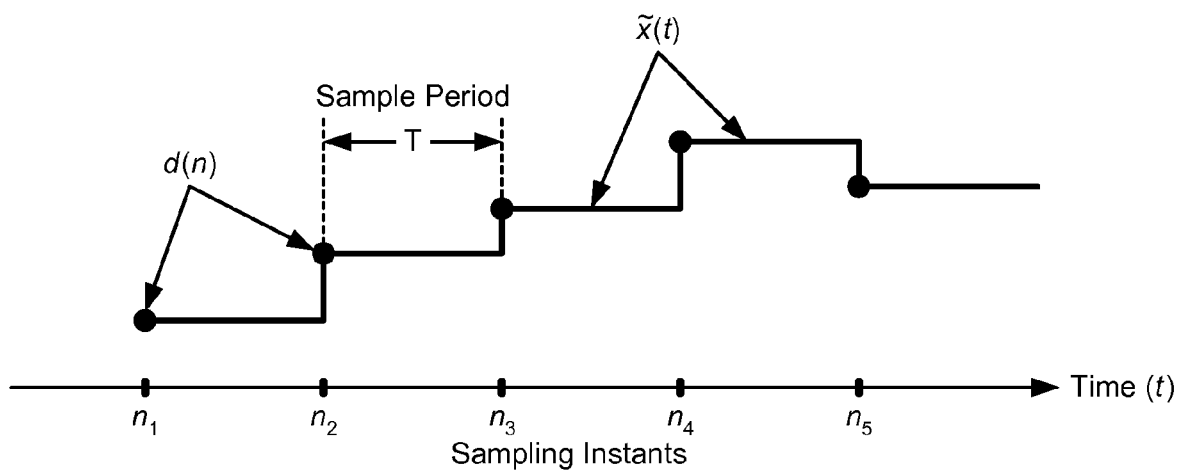
FIG. 1B shows a digital input signal and an analog input signal.

FIG. 1B shows a timing diagram of the digital input signal $d(n)$ and the analog input signal $\tilde{x}(t)$ in FIG. 1A. The digital input signal contains digital values at discrete time instants $n_1$, $n_2$, etc. DAC 120 generates the analog input signal $\tilde{x}(t)$ by outputting and holding each digital value for the entire duration of a sample period T. The analog input signal changes at each sampling instant to the new digital value for that sampling instant.

Figure 1C:
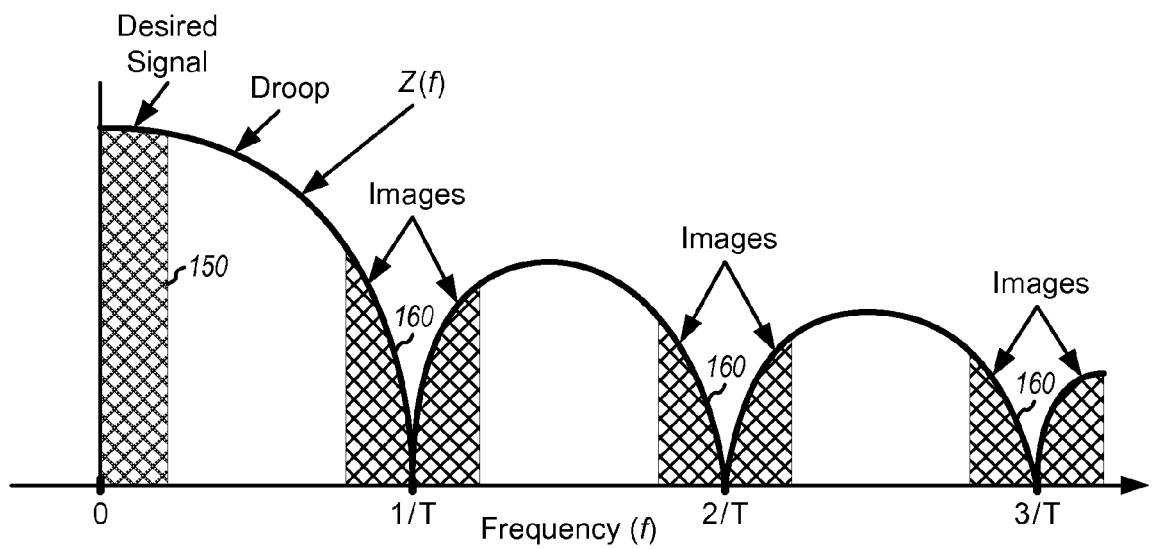
FIG. 1C shows a spectral response of the analog input signal.

FIG. 1C shows a frequency response $Z(f)$ of a time-domain step function due to zero-order hold. The zero-order hold by DAC 120 results in the frequency response $Z(f)$ having a sine $(x)/x$ shape, with the locations of the nulls being determined by the sample period T. The analog input signal $\tilde{x}(t)$ includes a desired signal component 150 at the origin (which is filtered by the droop) as well as images 160 at multiples of $1/T$ (which are filtered by the sine $(x)/x$ notches). For simplicity, only components at positive frequency are shown in FIG. 1C. Reconstruction filter 130 may attempt to attenuate the images at frequencies higher than $1/T$. Reconstruction filter 130 may also attempt to compensate for the droop in the passband due to the sine (x)/x response. The complexity of reconstruction filter 130 may be dependent on various factors such as the signal bandwidth, the sample rate, the desired amount of attenuation of the images, the desired passband response, etc. A relatively complex reconstruction filter may be used to meet applicable requirements and may increase the complexity and cost of device 100.

It is desirable to perform digital-to-analog conversion using a simple analog circuit while attaining good performance. This may be achieved by perform digital-to-analog conversion with first-order or higher-order hold. In general, the techniques described herein may be used for any order higher than zero-order hold. For clarity, certain aspects of the techniques are described below for first-order hold (FOH).

Figure 2:
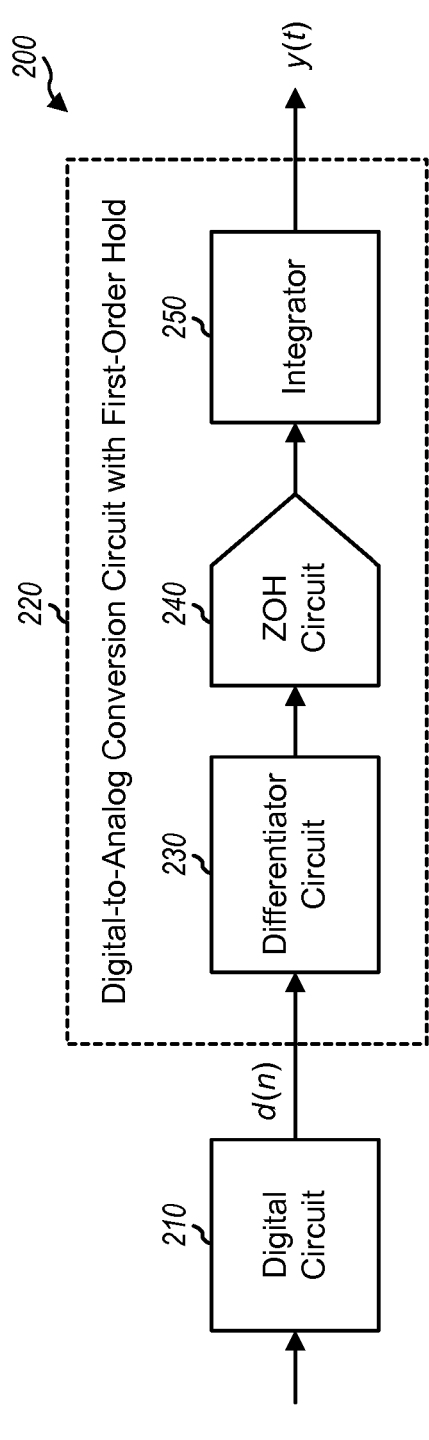
FIG. 2 shows digital-to-analog conversion with first-order hold.

FIG. 2 shows a block diagram of a design of a device 200 that performs digital-to-analog conversion with first-order hold. Within device 200, a digital circuit 210 receives and processes digital data and provides a digital input signal d(n) to a digital-to-analog conversion circuit 220. Within conversion circuit 220, a differentiator 230 differentiates the digital input signal and provides a differentiated signal. A ZOH circuit 240 converts the differentiated signal from digital to analog with zero-order hold and provides an analog input signal. An integrator 250 integrates the analog input signal and provides an analog output signal y(t).

The overall transfer function H(s) of conversion circuit 220 may be expressed as:

$$H(s) = \underbrace{\left[\frac{1-z^{-1}}{T}\right]_{z=e^{sT}}}_{Differentiator} \underbrace{\frac{1-e^{-sT}}{sT}}_{ZOH} \underbrace{\frac{1}{s}}_{Integrator} = \left(\frac{1-e^{-sT}}{sT}\right)^2, \quad \text{Eq (1)}$$

where $s=j\omega$, $\omega$ is the frequency in radians, and $z^{-1}$ denotes a delay of one sample period.

As shown in equation (1), zero-order hold has a transfer function of $$\frac{1-e^{-sT}}{sT}.$$

In general, L-th order hold has a transfer function of $$\left(\frac{1-e^{-sT}}{sT}\right)^{L+1},$$

where $L \geq 0$. Equation (1) indicates that first-order hold may be achieved with a combination of differentiator 230, ZOH circuit 240, and integrator 250 shown in FIG. 2.

Digital-to-analog conversion circuit 220 may be difficult or impractical to implement for several reasons. First, an ideal/pure integrator is typically not realizable but may be approximated by a circuit with a pole at low frequency. Second, both an integrator and a circuit with a pole are susceptible to low-frequency noise, drift, and disturbances that may severely degrade the quality of the analog output signal.

In an aspect, a digital-to-analog conversion circuit includes a simple analog circuit having one or more poles and a digital feedback circuit to improve low frequency behavior of the analog circuit. The conversion circuit can perform digital-to-analog conversion with a first-order or higher-order hold and can more smoothly reconstruct the analog output signal. The first-order or higher-order hold may be achieved by guiding the analog output signal from the analog circuit using feedback control techniques.

Figure 3:
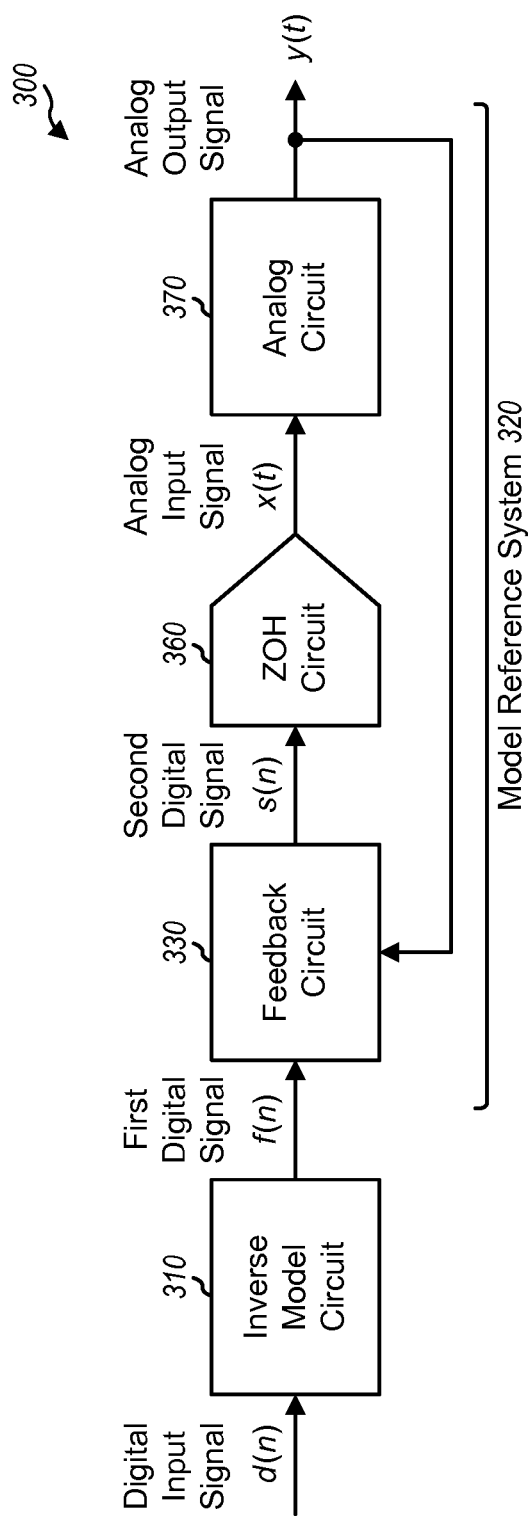
FIG. 3 shows a design of a digital-to-analog conversion circuit with first-order or higher-order hold and negative feedback.

FIG. 3 shows a block diagram of a design of a digital-to-analog conversion circuit 300 with first-order or higher-order hold and negative feedback. Within conversion circuit 300, an inverse model circuit 310 receives and processes a digital input signal d(n) as described below and provides a first digital signal f(n). A feedback circuit 330 receives the first digital signal and an analog output signal y(t) and generates a second digital signal s(n) that provides the desired analog output signal. A ZOH circuit 360 converts the second digital signal from digital to analog with zero-order hold and provides an analog input signal x(t). An analog circuit 370 operates on the analog input signal and provides the analog output signal y(t). Analog circuit 370 may approximate an integrator with a single pole or may implement a higher order filter with multiple poles.

Feedback circuit 330 performs several functions. First, feedback circuit 330 attempts to improve the low-frequency behavior of analog circuit 370. Second, feedback circuit 330 attempts to pass the signal content of the first digital signal. The combined transfer function of feedback circuit 330, ZOH circuit 360, and analog circuit 370, which form a model reference system 320, may be designed to closely match the combined transfer function of ZOH circuit 360 and analog circuit 370. Inverse model circuit 310 may have a transfer function that is an inverse of the transfer function of model reference system 320 so that the overall response of conversion circuit 300 is flat over a wide bandwidth.

Figure 4:
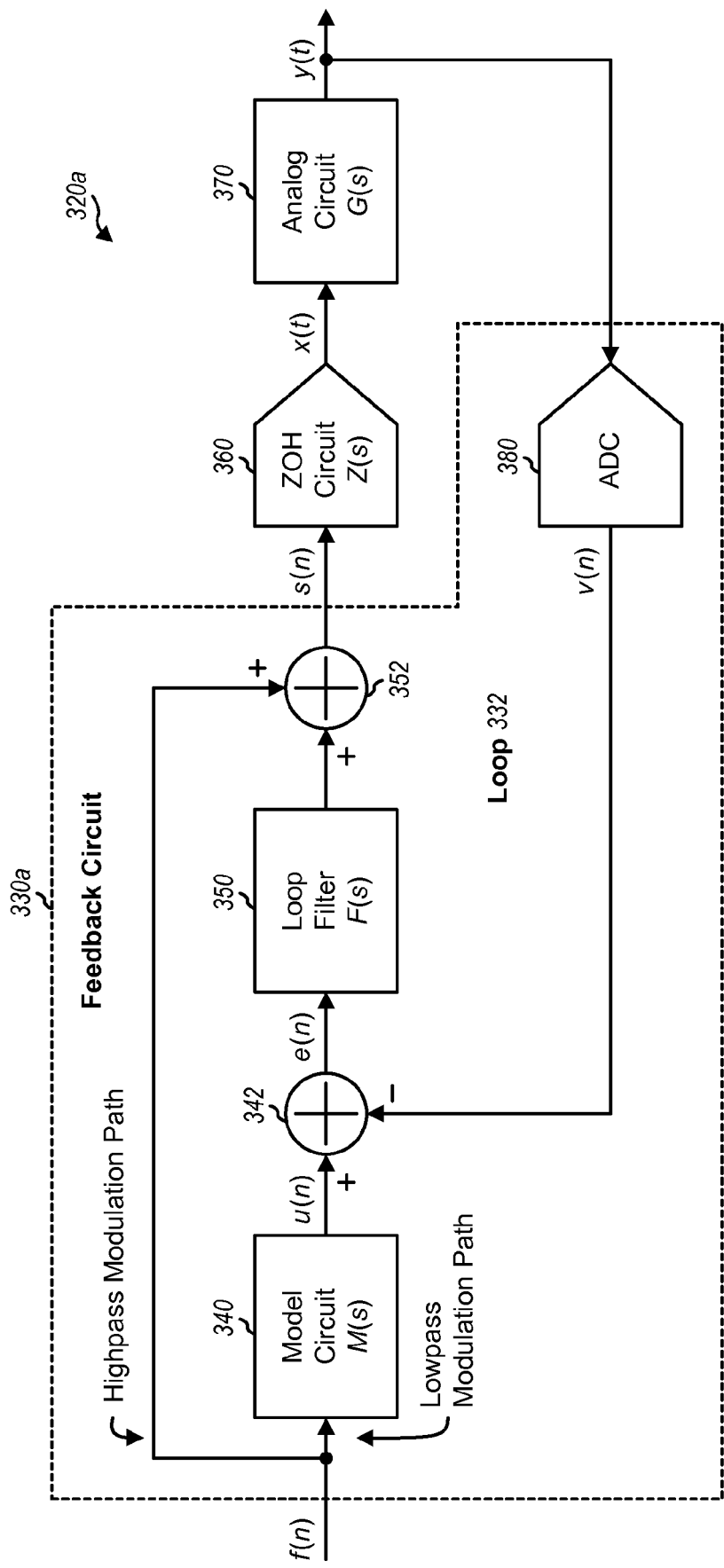
FIG. 4 shows a feedback circuit within the digital-to-analog conversion circuit.

FIG. 4 shows a block diagram of a model reference system 320a and a feedback circuit 330a, which are one design of model reference system 320 and feedback circuit 330 in FIG. 3. For simplicity, FIG. 4 shows the transfer functions of various circuits in the s-domain, which is commonly used for analog circuits and signals in continuous time. Feedback circuit 330a receives the first digital signal f(n) and the analog output signal y(t) and generates the second digital signal s(n).

Within feedback circuit 330a, a model circuit 340 receives the first digital signal f(n) and provides a model output signal u(n). An ADC 380 receives and digitizes the analog output signal y(t) and provides a digitalized output signal v(n). A summer 342 subtracts the digitalized output signal from the model output signal and provides an error signal e(n). A loop filter 350 filters the error signal and provides a filtered signal. A summer 352 sums the filtered signal and the first digital signal and provides the second digital signal s(n).

Feedback circuit 330a, ZOH circuit 360, and analog circuit 370 form a model reference adaptive control system and may be analyzed using adaptive control techniques. Loop filter 350 determines the noise filtering and loop dynamics of the adaptive control system. In one design, the transfer function F(s) of loop filter 350 may be expressed as:

$$F(s) = \frac{1}{s+p}, \quad \text{Eq (2)}$$

where p is the frequency of the pole of the loop filter.

The transfer function F(s) determines the closed-loop bandwidth of a loop 332 formed by summers 342 and 352, loop filter 350, ZOH circuit 360, analog circuit 370, and ADC 380. A narrow bandwidth for loop filter 350 may provide more noise filtering but slower response to transient. Conversely, a wider bandwidth for loop filter 350 may provide less noise filtering but faster response to transient. The bandwidth of loop filter 350 may be selected to achieve the desired noise filtering and loop dynamics.

Feedback circuit 330a implements two-point or dual-port modulation in order to achieve wideband modulation for the analog output signal. Within feedback circuit 330a, the first digital signal f(n) is provided to both a highpass modulation path and a lowpass modulation path. In the highpass modulation path, the first digital signal is provided directly from the input of feedback circuit 330a to summer 352. In the lowpass modulation path, the first digital signal is provided via model circuit 340, summer 342, and loop filter 350 to summer 352. The bandwidth of the lowpass modulation path is determined by model circuit 340 and loop filter 350 and may be relatively narrow. By applying the first digital signal via separate highpass and lowpass modulation paths, the adaptive control system can provide the second digital signal with a wider signal bandwidth than the closed-loop bandwidth of the adaptive control system.

Model circuit 340 has a transfer function of M(s), ZOH circuit 360 has a transfer function of Z(s), and analog circuit 370 has a transfer function of G(s) in the s-domain. The transfer function of model circuit 340 may be defined to match the combined transfer function of ZOH circuit 360 and analog circuit 370, as follows:

$$M(s) = Z(s) \cdot G(s). \quad\quad\quad \text{Eq (3)}$$

If equation (3) is achieved, then the combined transfer function of feedback circuit 330a, ZOH circuit 360, and analog circuit 370 would be equal to Z(s)·G(s). In this case, feedback circuit 330a can improve the low frequency behavior of analog circuit 370 while minimally impacting the overall transfer function.

Figure 5:
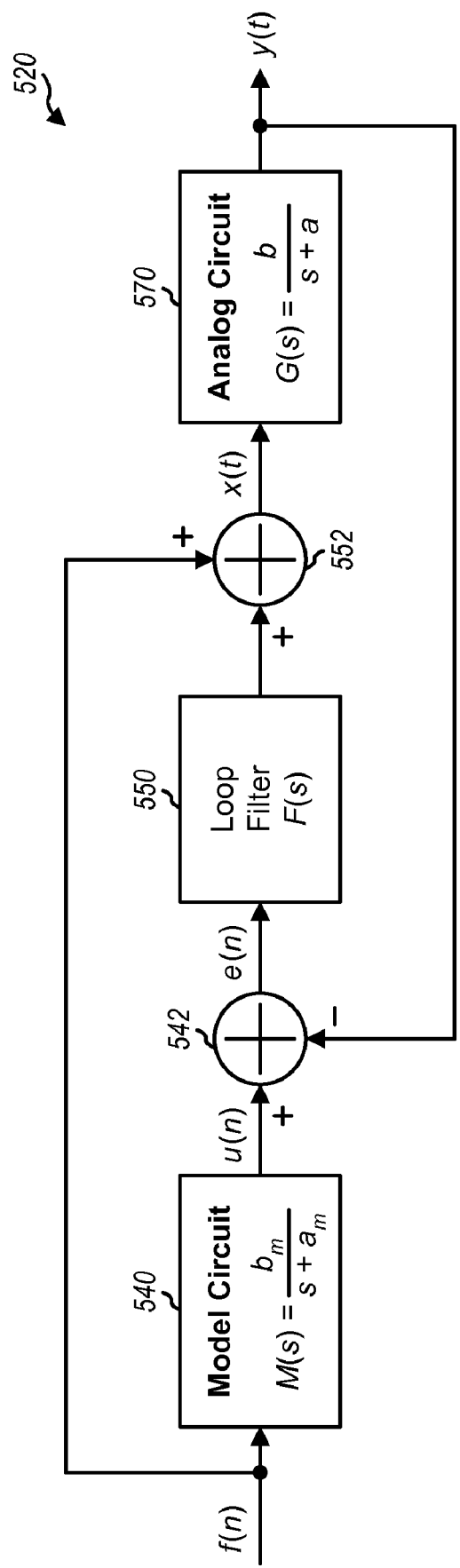
FIG. 5 shows a model reference system for the digital-to-analog conversion circuit.

FIG. 5 shows a block diagram of a model reference control system 520, which is a model of model reference system 320 in FIG. 3. For simplicity, ZOH circuit 360 and ADC 380 in FIG. 4 are omitted from system 520. In system 520, a model circuit 540, a summer 542, a loop filter 550, and a summer 552 are coupled in the same manner as model circuit 340, summer 342, loop filter 350, and summer 352, respectively, in FIG. 4. An analog circuit 570 is coupled directly to the output of summer 552.

For first-order hold, the transfer function G(s) of analog circuit 570 and the transfer function M(s) of model circuit 540 may be expressed as:

$$G(s) = \frac{b}{s+a}, \text{ and} \quad\quad\quad \text{Eq (4)}$$

$$M(s) = \frac{b_m}{s+a_m}, \quad\quad\quad \text{Eq (5)}$$

where a is the frequency of the pole of analog circuit 570,
b is the gain of analog circuit 570,
$a_m$ is the frequency of the pole of model circuit 540, and
$b_m$ is the gain of model circuit 540.

The transfer function G(s) in equation (4) may be implemented with a current source in parallel with a resistor (R) and a capacitor (C), a passive RC filter, a switched-capacitor filter, etc. The pole frequency a may be determined by the values of the resistor and capacitor. The gain b may be dependent on the gain of the current source and/or other active circuit driving the resistor and capacitor.

In model reference control system 520, analog circuit 570 is a plant to be controlled. The term "plant" is commonly used within a control system for a block whose output is to be controlled by applying an appropriate input. For model reference control system 520, the plant (which is analog circuit 570 with transfer function G(s) in equation (4)) is encouraged to follow the model (which is model circuit 540 with transfer function M(s) in equation (5)). If the pole frequency $a_m$ and gain $b_m$ of model circuit 540 match the pole frequency a and gain b of analog circuit 570, then the overall transfer function of system 520 is the same as the transfer function of model circuit 540.

The pole frequency and gain of analog circuit 570 may be set to desired values. However, due to component tolerances and/or other factors, the pole frequency and gain of analog circuit 570 may be different from the desired values and/or may not be known. In this case, the pole frequency and gain of analog circuit 570 may be adaptively determined.

Figure 6:
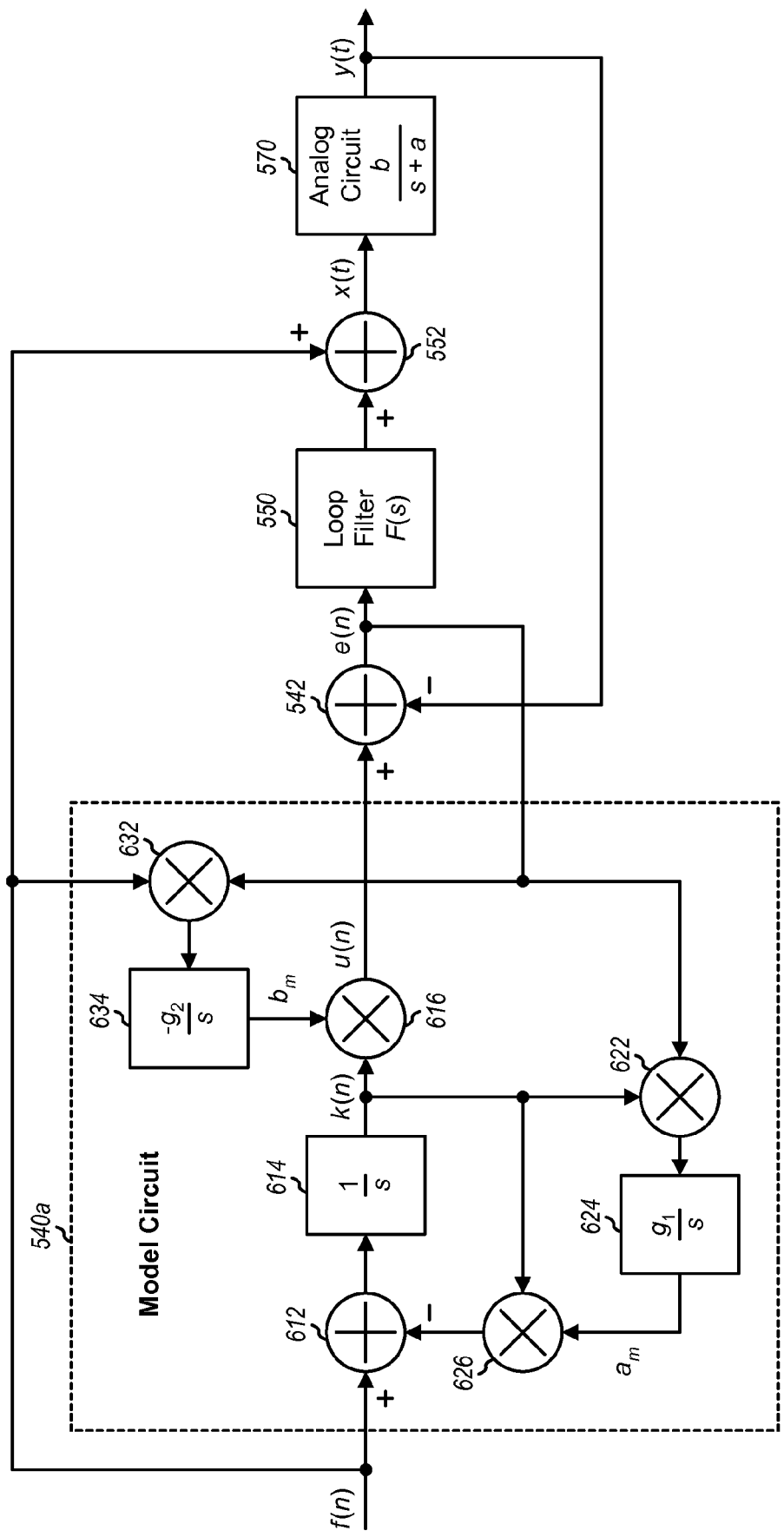
FIG. 6 shows a model circuit within the feedback circuit.

FIG. 6 shows a block diagram of a model circuit 540a, which is one design of model circuit 540 in FIG. 5. In this design, model circuit 540a adaptively estimates the parameters a and b of analog circuit 570 and applies the estimated parameters $a_m$ and $b_m$ for its transfer function M(s).

Within model circuit 540a, a summer 612 receives and subtracts an output of a multiplier 626 from the first digital signal f(n). An accumulator 614 accumulates the output of summer 612 and provides an accumulated signal k(n). A multiplier 616 multiplies the accumulated signal with $b_m$ from a circuit 634 and provides the model output signal u(n).

A multiplier 622 multiplies the accumulated signal k(n) with the error signal e(n) from summer 542. A circuit 624 scales the output of multiplier 622 with a gain $g_1$, accumulates the scaled result, and provides $a_m$, which is an estimate of the pole frequency a of analog circuit 570. A multiplier 626 multiplies the accumulated signal k(n) with $a_m$ and provides its output to summer 612.

A multiplier 632 multiplies the first digital signal f(n) with the error signal e(n). A circuit 634 scales the output of multiplier 632 with a gain $-g_2$, accumulates the scaled result, and provides $b_m$, which is an estimate of gain b of analog circuit 570.

Gain $g_1$ of circuit 624 determines the adaptation rate for parameter $a_m$, and gain $g_2$ of circuit 634 determines the adaptation rate for parameter $b_m$. Gains $g_1$ and $g_2$ may be selected to achieve the desired adaptation rates for $a_m$ and $b_m$, respectively. Once the adaptation has converged, $a_m$ should closely match a, and $b_m$ should closely match b. Model circuit 540a would then implement the transfer function M(s) shown in equation (5).

FIG. 6 shows one design of adaptively estimating the parameters of analog circuit 570 and applying the estimated parameters to model circuit 540. The parameters of analog circuit 570 may also be estimated in other manners.

Figure 7:
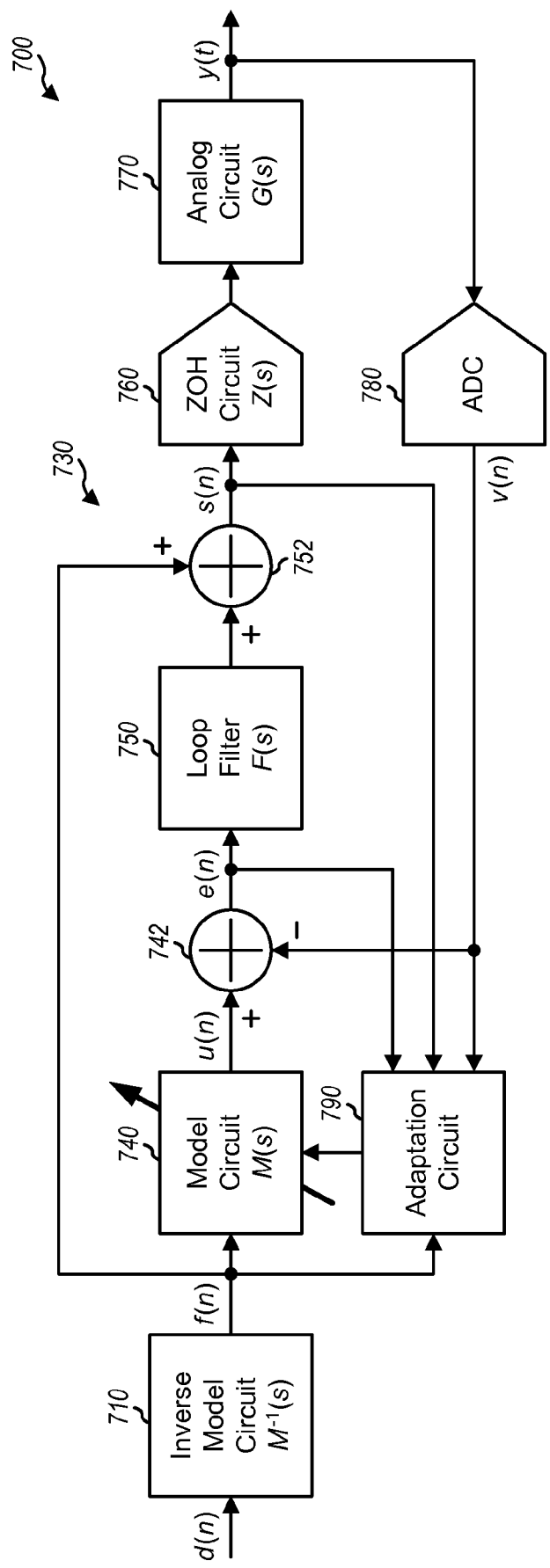
FIG. 7 shows another design of a digital-to-analog conversion circuit with first-order or higher-order hold and negative feedback.

FIG. 7 shows a block diagram of a design of a digital-to-analog conversion circuit 700 with first-order or higher-order hold and negative feedback. Conversion circuit 700 includes an inverse model circuit 710, a feedback circuit 730, a ZOH circuit 760, and an analog circuit 770, which are coupled in the same manner as inverse model circuit 310, feedback circuit 330, ZOH circuit 360, and analog circuit 370, respectively, in FIG. 3.

In the design shown in FIG. 7, feedback circuit 730 includes a model circuit 740, a summer 742, a loop filter 750, a summer 752, and an ADC 780 that are coupled in the same manner as model circuit 340, summer 342, loop filter 350, summer 352, and ADC 380, respectively, in FIG. 4. Feedback circuit 730 further includes an adaptation circuit 790 that may receive the first digital signal f(n), the error signal e(n), the second digital signal s(n), and/or the digitized output signal v(n). Adaptation circuit 790 may estimate parameters of the transfer function Z(s) of ZOH circuit 760 and/or the transfer function G(s) of analog circuit 770. The transfer function M(s) of model circuit 740 may be defined based on the estimated parameters to match the combined transfer function Z(s)·G(s) of ZOH circuit 760 and analog circuit 770. For first-order hold, adaptation circuit 790 may be implemented as shown in FIG. 6. For higher-order hold, adaptation circuit 790 may be implemented using feedback control techniques described by Landau, Y. D., in "Adaptive Control, The Model Reference Approach," Marcel Dekker, Inc., 1979. Inverse model circuit 710 has a transfer function $M^{-1}(s)$, which is the inverse of the transfer function M(s) of model circuit 740.

Digital-to-analog conversion circuit 700 may implement first-order or higher-order hold. For a true L-th order hold, the plant includes L integrators coupled in cascade, where L may be one or greater. These L integrators may be approximated with L poles at sufficiently high frequencies. For L-th order hold, analog circuit 770 may include L poles to approximate the L integrators. As an example, for second-order hold, analog circuit 770 may include two poles and may have the following transfer function:

$$G(s) = \left(\frac{b_1}{s+a_1}\right) \cdot \left(\frac{b_2}{s+a_2}\right),$$ Eq (6)

where $a_1$ and $a_2$ are the frequencies of the two poles, and $b_1$ and $b_2$ are the gains associated with the two poles.

For any given order L, model circuit 740 may have a combined transfer function of ZOH circuit 760 and analog circuit 770.

For clarity, FIGS. 5 and 6 omit ZOH circuit 360 and ADC 380 in FIG. 4. Furthermore, FIGS. 4 through 7 show the transfer functions of various circuits in the s-domain, which is commonly used for analog circuits and signals in continuous time. In a practical implementation, only the analog circuit and parts of the ZOH circuit and the ADC are analog/continuous, and the remaining circuits are digital/discrete time. Thus, all circuits to the left of the ZOH circuit and the ADC may be implemented with digital circuits.

Since the model circuit is implemented digitally in discrete time, the analog circuit may be controlled only at discrete time instants corresponding to the sampling instants. Between the sampling instants, the analog output signal y(t) is dependent on the continuous time response of the analog circuit. The ZOH circuit receives the second digital signal s(n) and provides a step response to the analog circuit for each sample in the second digital signal, e.g., as shown in FIG. 1B. The analog output signal between sampling instants is determined by the step response of the analog circuit.

For first-order hold, the step response g(t) of an analog circuit with a single-pole transfer function G(s) shown in equation (4) may be expressed as:

$$g(t) = \frac{b}{a} \cdot (1 - e^{-a \cdot t}) = \frac{b}{a} \cdot \left( a \cdot t - \frac{(a \cdot t)^2}{2!} + \frac{(a \cdot t)^3}{3!} + \ldots \right),$$ Eq (7)

where "!" denotes a factorial.

In equation (7), b/a is the gain at DC and is a scaling factor. The step response may be approximated with a series of terms of different orders to the right of the second equal sign in equation (7). The first term a·t is a straight line with a slope of a. The subsequent terms may be considered as errors to the straight line. If the pole frequency is much lower than the sampling frequency, or a<<1/T, then g(t) is almost linear between samples. For example, the pole frequency may be on the order of kilohertz (KHz) whereas the sampling frequency may be on the order of megahertz (MHz). If the pole frequency a is relatively low, then the analog output signal would be a near piece-wise linear interpolation of the samples, and the digital-to-analog conversion circuit would be close to first-order hold.

FIG. 8 shows a timing diagram of the analog input signal x(t) from the ZOH circuit and the analog output signal y(t) from the analog circuit in digital-to-analog conversion circuit 300 or 700 with first-order hold. The analog input signal x(t) is shown with a dashed line and has a step response at each sampling instant $n_1$, $n_2$, etc. The analog output signal y(t) varies approximately linearly between sampling instants due to the single-pole transfer function G(s) shown in equation (4). In practice, the FOH response in FIG. 8 will be delayed by at least one sample to allow time for necessary processing.

FIG. 9 shows a design of a process 900 for performing digital-to-analog conversion based on the techniques described herein. A digital input signal may be processed with an inverse model circuit to obtain a first digital signal (block 912). The first digital signal and an analog output signal from an analog circuit may be processed with a feedback circuit to obtain a second digital signal (block 914). The second digital signal may be converted from digital to analog with zero-order hold to obtain an analog input signal for the analog circuit (block 916). The analog input signal may be passed through the analog circuit to obtain the analog output signal (block 918).

The analog circuit may comprise one or more poles. For first-order hold, the analog circuit may have the transfer function shown in equation (4). For second-order hold, the analog circuit may have the transfer function shown in equation (6). The frequency of each pole of the analog circuit may be much lower (e.g., at least ten times lower) than the sampling frequency of the first digital signal.

FIG. 10 shows a design of block 914 in FIG. 9. The first digital signal may be processed with a model circuit to obtain a model output signal (block 1012). The analog output signal may be digitalized with an ADC to obtain a digitized output signal (block 1014). The digitalized output signal may be subtracted from the model output signal to obtain an error signal (block 1016). The error signal may be filtered with a loop filter to obtain a filtered signal (block 1018). The filtered signal may be summed with the first digital signal to obtain the second digital signal (block 1020).

The model circuit may have a transfer function determined based on the transfer function of the ZOH circuit and the analog circuit. An adaptation circuit may estimate at least one parameter of the analog circuit, and the transfer function of the model circuit may be implemented based on the estimated parameter(s). For example, the adaptation circuit may estimate the pole frequency and gain of the analog circuit, and the transfer function of the model circuit may be implemented based on the estimated pole frequency and gain. The loop filter may perform noise filtering and may have a bandwidth much smaller than the bandwidth of the first digital signal.

In the designs shown in FIGS. 4 through 7, the main noise sources are flicker noise and white noise from the analog circuit and feedback noise from the ADC in the feedback path. The white noise is largely outside the loop bandwidth and is thus not controlled or mitigated. The analog circuit may be designed to achieve an acceptable level of white noise. The flicker noise is dominant at low frequencies and may be suppressed by the loop if the loop bandwidth is sufficiently high. The minimum bandwidth of the loop may be dependent on (e.g., larger than) the corner frequency of the flicker noise. The maximum bandwidth of the loop may be dependent on the noise injected by the ADC in the feedback path. The loop bandwidth may be selected based on a tradeoff between the amount of flicker noise to suppress (with larger loop bandwidth being better) and the amount of feedback noise to suppress (with smaller loop bandwidth being better).

A noise-shaping converter may be used for the ADC in the feedback path in order to mitigate the feedback noise. The noise-shaping converter can digitize the analog output signal such that much of the quantization noise is pushed to higher frequencies, e.g., into the stopband of the loop filter. If the DAC described herein is used in each of the inphase (I) and quadrature (Q) branches of a quadrature upconverter and if a first-order sigma-delta ($\Sigma\Delta$) modulator is used in the feedback path of each DAC, then an error vector magnitude (EVM) may be expressed as:

$$EVM = 100 \cdot \left( \frac{\pi^2}{3} q^2 \frac{(2/2^N)^2}{12} \frac{1}{OSR^3} \right)^{1/2}, \qquad \text{Eq (8)}$$

where q is the peak to root-mean-square (rms) ratio of an I or Q signal,

N is the number of bits from each $\Sigma\Delta$ modulator, and

OSR is an oversampling ratio, which is the sampling frequency divided by twice the signal bandwidth (i.e., the loop bandwidth in this example).

For example, one-bit first-order $\Sigma\Delta$ modulators may be used in the I and Q DACs for Wideband Code Division Multiple Access (WCDMA) signals sampled at four times the chip rate. In this case, $q\approx 2$, and EVM$\approx$0.06% for a loop bandwidth of 50 KHz. This low EVM may be negligible.

In general, the loop may be able to reject flicker noise with a corner frequency less than the loop bandwidth. A higher loop bandwidth may be used to combat a higher corner frequency for flicker noise. However, the feedback noise from the ADC should be lower by a corresponding amount in order to avoid excessive degradation.

The digital-to-analog conversion circuit described herein may reduce the dynamic range requirement of the ZOH circuit. As shown in FIGS. 3 and 7, the digital-to-analog conversion circuit may include an inverse model circuit, which may be an approximation of a differentiator. In this case, the second digital signal s(n) provided to the ZOH circuit is the derivative of the digital input signal d(n), and this derivative is the difference between adjacent samples in discrete time. The digital input signal d(n) is typically smooth and oversampled, so the peak difference between adjacent samples in the digital input signal may be much smaller than the peak of the digital input signal itself. Thus, the input dynamic range of the ZOH circuit may be reduced. As an example, for WCDMA, a first-order hold may reduce the input dynamic range of the ZOH circuit by two or more bits, and a second-order hold may reduce the input dynamic range by four or more bits.

The digital-to-analog conversion circuit described herein utilizes a simple analog circuit (e.g., with one or more poles) and guides the output of the analog circuit with sample-data control techniques. In general, the order (and therefore the complexity) of the analog circuit will determine the smoothness of the reconstruction of the analog output signal. A reconstruction filter may or may not be needed after the analog circuit or may be simplified depending on the design of the digital-to-analog conversion circuit and the output signal requirements.

The digital-to-analog conversion circuit described herein may provide several advantages. First, the analog circuit may be relatively simple, e.g., a single pole. The simple analog circuit may also mean that the circuit parameters (e.g., the pole frequency a and gain b) may be identified more easily and subsequently corrected digitally. Second, the sample rate may be determined based only on the need to control the analog circuit and not solely by the frequency of the digital image. A lower sample rate may be used for the digital input signal, which may reduce power consumption. Third, the input dynamic range of the ZOH circuit may be reduced due to the inverse model circuit prior to the feedback circuit.

The advantages described above may be greater for higher-order holds at the expense of greater complexity of the feedback circuit. For example, higher-order holds may provide smoother signal reconstruction, lower input dynamic range for the ZOH circuit, lower sample rate, etc. As an example, for WCDMA with second-order hold, the sample rate may be reduced by as much as eight-fold, e.g., from 32 times chip rate (chip×32) to four times chip rate (chip×4).

The digital-to-analog conversion circuit described herein may be used for various applications such as communication, computing, networking, personal electronics, etc. For example, the digital-to-analog conversion circuit may be used for wireless communication devices, cellular phones, personal digital assistants (PDAs), handheld devices, gaming devices, computing devices, laptop computers, consumer electronics devices, personal computers, cordless phones, etc. An example use of the digital-to-analog conversion circuit in a wireless communication device is described below.

Figure 11:
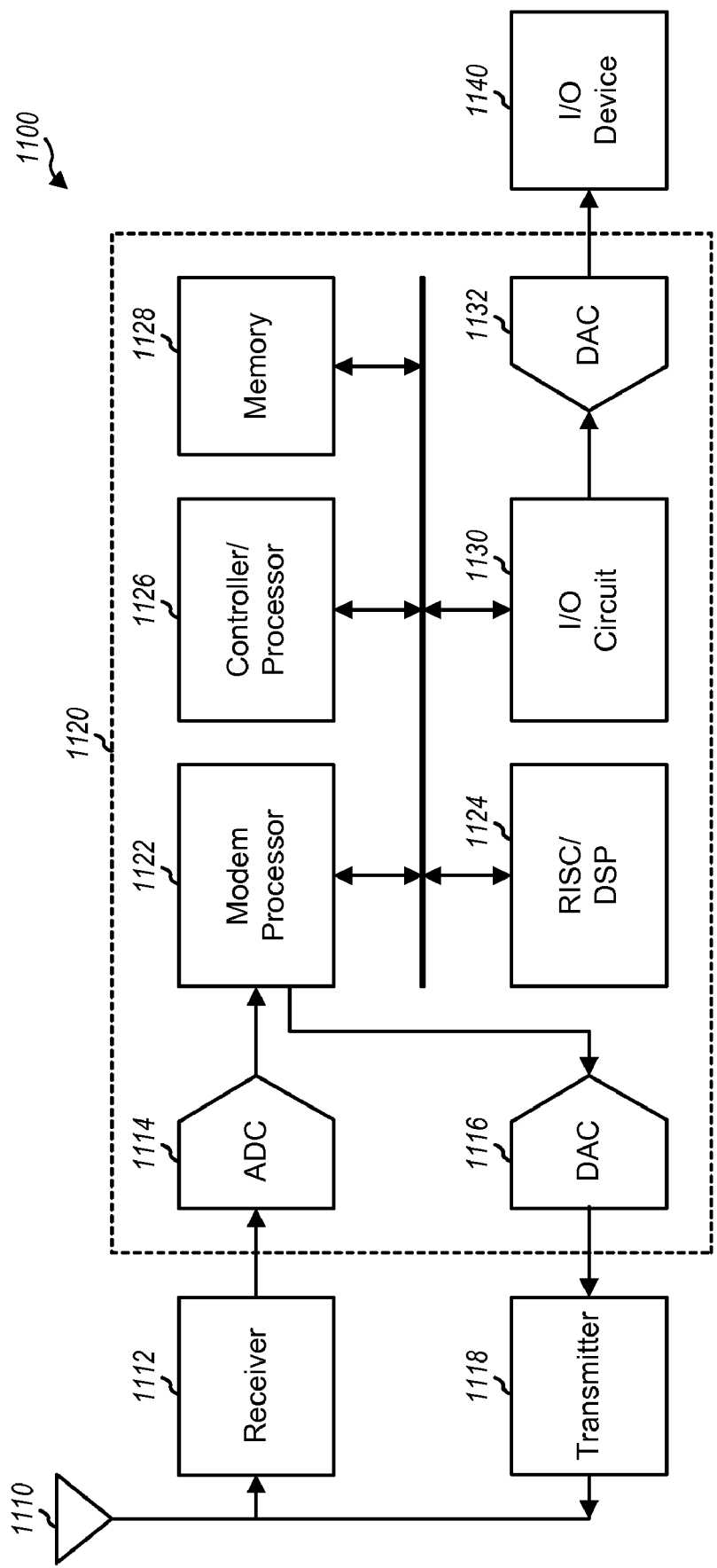
FIG. 11 shows a block diagram of a wireless communication device.

FIG. 11 shows a block diagram of a design of a wireless communication device 1100 for a wireless communication system. Wireless device 1100 may be a cellular phone, a terminal, a handset, a wireless modem, etc. The wireless communication system may be a cdma2000 system, a WCDMA system, a Global System for Mobile Communications (GSM) system, etc.

Wireless device 1100 is capable of providing bi-directional communication via a receive path and a transmit path. On the receive path, signals transmitted by base stations (not shown) are received by an antenna 1110 and provided to a receiver 1112. Receiver 1112 conditions the received signal and provides input baseband signals to an ADC 1114 within a section 1120. On the transmit path, a DAC 1116 receives data to be transmitted and provides output baseband signals to a transmitter 1118. DAC 1116 may be implemented with the digital-to-analog conversion circuit described herein. Transmitter 1118 processes and conditions the baseband output signals and generates a modulated signal, which is transmitted via antenna 1110 to the base stations. Receiver 1112 and transmitter 1116 may support cdma2000, WCDMA, GSM, etc.

Section 1120 includes various processing, interface and memory units such as, for example, a modem processor 1122, a reduced instruction set computer/digital signal processor (RISC/DSP) 1124, a controller/processor 1126, a memory 1128, and an input/output (I/O) circuit 1130. Modem processor 1122 may perform processing for data transmission and reception, e.g., encoding, modulation, demodulation, decoding, etc. RISC/DSP 1124 may perform general and specialized processing for wireless device 1100. Controller/processor 1126 may direct the operation of various units within section 1120. Memory 1128 may store data and/or instructions for various units within section 1120. I/O circuit 1130 may communicate with an external I/O device 1140 via a DAC 1132, which may be implemented with the digital-to-analog conversion circuit described herein.

The digital-to-analog conversion circuit described herein may be implemented by various means. For example, the digital-to-analog conversion circuit may be implemented in hardware, firmware, software, or a combination thereof. For a hardware implementation, the various circuits of the digital-to-analog conversion circuit may be implemented on an integrated circuit (IC), an analog IC, a radio frequency IC (RFIC), a mixed-signal IC, an application specific integrated circuit (ASIC), a digital signal processor (DSP), a digital signal processing device (DSPD), a programmable logic device (PLD), a field programmable gate array (FPGA), a processor, a controller, a micro-controller, a microprocessor, an electronic device, other electronic units designed to perform the functions described herein, a computer, or a combination thereof.

The digital-to-analog conversion circuit may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

Certain portions of the digital-to-analog conversion circuit may be implemented with firmware and/or software code (e.g., procedures, functions, modules, instructions, etc.) that performs the functions described herein. In general, any computer/processor-readable medium tangibly embodying firmware and/or software code may be used in implementing the techniques described herein. For example, the firmware and/or software code may be stored in a memory (e.g., memory 1128 in FIG. 11) and executed by a processor (e.g., processor 1126). The memory may be implemented within the processor or external to the processor.

The firmware and/or software code may be stored on or transmitted over a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise random access memory (RAM), read-only memory (ROM), non-volatile random access memory (NVRAM), programmable read-only memory (PROM), electrically erasable PROM (EEPROM), FLASH memory, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

An apparatus implementing the digital-to-analog conversion circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. A non-transitory computer-readable medium having stored thereon computer-executable software instructions configured to cause a computer processor to perform steps comprising:

processing a first digital signal with a model circuit to obtain a model output signal;

subtracting a digitalized output signal from the model output signal to obtain an error signal;

the error signal with a loop filter to obtain a filtered signal; and summing the filtered signal with the first digital signal to obtain a second digital signal suitable for conversion from digital to analog with zero-order hold and an analog circuit to obtain an analog output signal.

2. The non-transitory computer-readable medium of claim 1, wherein the non-transitory computer-readable medium has computer-executable software instructions configured to cause the wireless terminal processor to perform further steps comprising:

estimating at least one parameter of the analog circuit; and implementing a transfer function of the model circuit based on the at least one estimated parameter.

3. An integrated circuit comprising:

a feedback circuit configured to receive an analog output signal from an analog circuit and a first digital signal and to provide a second digital signal;

a zero-order hold (ZOH) circuit coupled to the feedback circuit and configured to receive the second digital signal and provide an analog input signal for the analog circuit, the feedback circuit, the ZOH circuit, and the analog circuit performing digital-to-analog conversion with first-order or higher-order hold; and an inverse model circuit coupled to the feedback circuit and configured to receive a digital input signal and provide the first digital signal, the inverse model circuit having a transfer function determined based on an inverse of a combined transfer function of the ZOH circuit and the analog circuit.

4. The integrated circuit of claim 3, wherein the feedback circuit comprises:

a model circuit configured to receive the first digital signal and provide a model output signal;

a first summer configured to subtract a digitalized output signal from the model output signal and provide an error signal;

a loop filter configured to filter the error signal and provide a filtered signal; and a second summer configured to sum the filtered signal and the first digital signal and provide the second digital signal.

5. A method of performing digital-to-analog conversion with first-order or higher-order hold, comprising:
processing an analog output signal from an analog circuit and a first digital signal with a feedback circuit to obtain a second digital signal;
converting the second digital signal from digital to analog with zero-order hold to obtain an analog input signal for the analog circuit;
passing the analog input signal through the analog circuit to obtain the analog output signal; and
processing a digital input signal with a transfer function, determined based on an inverse of a combined transfer function of the zero-order hold and the analog circuit, to obtain the first digital signal.

6. The method of claim 5, wherein the processing the analog output signal and the first digital signal with the feedback circuit comprises:
processing the first digital signal with a model circuit to obtain a model output signal;
subtracting a digitalized output signal from the model output signal to obtain an error signal;
filtering the error signal with a loop filter to obtain a filtered signal; and
summing the filtered signal with the first digital signal to obtain the second digital signal.

7. The method of claim 6, further comprising:
estimating at least one parameter of the analog circuit; and
implementing a transfer function of the model circuit based on the at least one estimated parameter.

8. The method of claim 6, further comprising:
estimating a pole frequency and a gain of the analog circuit; and
implementing a transfer function of the model circuit based on the estimated pole frequency and gain.

9. An apparatus for performing digital-to-analog conversion with first-order or higher-order hold, comprising:
means for processing an analog output signal from an analog circuit and a first digital signal with a feedback circuit to obtain a second digital signal;
means for converting the second digital signal from digital to analog with zero-order hold to obtain an analog input signal for the analog circuit;
means for passing the analog input signal through the analog circuit to obtain the analog output signal; and
means for processing a digital input signal with a transfer function, determined based on an inverse of a combined transfer function of the zero-order hold and the analog circuit, to obtain the first digital signal.

10. The apparatus of claim 9, wherein the means for processing the analog output signal and the first digital signal with the feedback circuit comprises:
means for processing the first digital signal with a model circuit to obtain a model output signal;
means for subtracting a digitalized output signal from the model output signal to obtain an error signal;
means for filtering the error signal with a loop filter to obtain a filtered signal; and
means for summing the filtered signal with the first digital signal to obtain the second digital signal.

11. The apparatus of claim 10, further comprising:
means for estimating at least one parameter of the analog circuit; and
means for implementing a transfer function of the model circuit based on the at least one estimated parameter.

12. The apparatus of claim 10, further comprising:
means for estimating a pole frequency and a gain of the analog circuit; and
means for implementing a transfer function of the model circuit based on the estimated pole frequency and gain.

13. An apparatus comprising:
a feedback circuit configured to receive an analog output signal from an analog circuit and a first digital signal and to provide a second digital signal;
a zero-order hold (ZOH) circuit coupled to the feedback circuit and configured to receive the second digital signal and provide an analog input signal for the analog circuit, the feedback circuit, the ZOH circuit, and the analog circuit performing digital-to-analog conversion with first-order or higher-order hold; and
an inverse model circuit coupled to the feedback circuit and configured to receive a digital input signal and provide the first digital signal, the inverse model circuit having a transfer function determined based on an inverse of a combined transfer function of the ZOH circuit and the analog circuit.

14. The apparatus of claim 13, wherein the feedback circuit is configured to perform low frequency noise filtering based on the analog output signal.

15. The apparatus of claim 13, wherein the feedback circuit comprises a model circuit having a transfer function determined based on a transfer function of the analog circuit.

16. The apparatus of claim 15, wherein the transfer function of the model circuit is determined based further on a transfer function of the ZOH circuit.

17. The apparatus of claim 15, wherein the feedback circuit further comprises an adaptation circuit configured to estimate at least one parameter of the analog circuit, and wherein the transfer function of the model circuit is based on the at least one estimated parameter.

18. The apparatus of claim 15, wherein the feedback circuit farther comprises an adaptation circuit configured to estimate a pole frequency and a gain of the analog circuit, and wherein the transfer function of the model circuit is based on the estimated pole frequency and gain.

19. The apparatus of claim 13, wherein the feedback circuit comprises:
a model circuit configured to receive the first digital signal and provide a model output signal;
a first summer configured to subtract a digitalized output signal from the model output signal and provide an error signal;
a loop filter configured to filter the error signal and provide a filtered signal; and
a second summer configured to sum the filtered signal and the first digital signal and provide the second digital signal.

20. The apparatus of claim 19, wherein the loop filter is configured to perform noise filtering with a bandwidth smaller than a bandwidth of the first digital signal.

21. The apparatus of claim 19, wherein the feedback circuit farther comprises an analog-to-digital converter (ADC) configured to digitize the analog output signal and provide the digitized output signal.

22. The apparatus of claim 21, wherein the ADC comprises a noise-shaping modulator.

23. The apparatus of claim 13, wherein the feedback circuit comprises:
a highpass modulation path for the first digital signal; and
a lowpass modulation path for the first digital signal.

24. The apparatus of claim 13, wherein the analog circuit comprises at least one pole.

25. The apparatus of claim 13, wherein the analog circuit has an s-domain transfer function G(s) of $$G(s) = \frac{b}{s+a},$$

where a is frequency of a pole of the analog circuit and b is a gain of the analog circuit.

26. The apparatus of claim 14, wherein the frequency of the pole is at least ten times lower than a sampling frequency of the first digital signal.

\* \* \* \* \*